United States Patent
Jeong

(10) Patent No.: US 9,275,883 B2
(45) Date of Patent: Mar. 1, 2016

(54) APPARATUS FOR SUBSTRATE TRANSPORTATION USING ELECTROSTATIC FLOATING

(71) Applicant: YAS Co., LTD, Paju-si (KR)

(72) Inventor: Kwang-Ho Jeong, Goyang-si (KR)

(73) Assignee: YAS CO., LTD., Paju (KR)

( * ) Notice: Subject to any disclaimer, the term of this patent is extended or adjusted under 35 U.S.C. 154(b) by 0 days.

(21) Appl. No.: 14/216,330

(22) Filed: Mar. 17, 2014

(65) Prior Publication Data

US 2014/0262691 A1    Sep. 18, 2014

(30) Foreign Application Priority Data

Mar. 18, 2013   (KR) .................. 10-2013-0028405

(51) Int. Cl.
- *B65G 35/00* (2006.01)
- *B65G 51/03* (2006.01)
- *H01L 21/677* (2006.01)

(52) U.S. Cl.
CPC ........ *H01L 21/677* (2013.01); *H01L 21/67709* (2013.01)

(58) Field of Classification Search
CPC ...... H01L 21/683; H01L 21/677; B23Q 3/15; H02N 13/00; B65G 51/03
USPC ................. 198/690.1, 619; 361/234
See application file for complete search history.

(56) References Cited

U.S. PATENT DOCUMENTS

| | | | | |
|---|---|---|---|---|
| 6,370,005 | B1* | 4/2002 | Sun et al. | 361/234 |
| 2007/0297118 | A1* | 12/2007 | Fujii | 361/234 |
| 2010/0096262 | A1* | 4/2010 | Aruga et al. | 204/298.08 |
| 2014/0133062 | A1* | 5/2014 | Prahlad et al. | 361/234 |
| 2014/0169927 | A1* | 6/2014 | Golda et al. | 414/800 |
| 2014/0241848 | A1* | 8/2014 | Vopat et al. | 414/805 |

FOREIGN PATENT DOCUMENTS

| | | |
|---|---|---|
| JP | 63-188561 | 8/1988 |
| JP | 5-22960 | 1/1993 |
| JP | 2000-025948 A | 1/2000 |
| JP | 2010-158128 | 7/2010 |
| KR | 20080013740 A | 2/2008 |
| KR | 20090058333 A | 6/2009 |
| KR | 20120107892 A | 10/2012 |
| KR | 101222328 B1 | 2/2013 |

OTHER PUBLICATIONS

Japanese Patent Office—Office Action dated Jan. 21, 2015.

* cited by examiner

*Primary Examiner* — James R Bidwell

(74) *Attorney, Agent, or Firm* — Patent Office of Dr. Chung Park

(57) ABSTRACT

The intent of this invention is to provide an apparatus for substrate transportation that is to carry the substrate without any mechanical contact when the substrate is required to be transported in various manufacturing processes including semiconductor, display and the like.

12 Claims, 6 Drawing Sheets

$$V_s = V_{lf} \frac{C}{C+C_s}$$

APPARATUS FOR SUBSTRATE TRANSPORTATION USING ELECTROSTATIC FLOATING

CROSS-REFERENCE TO RELATED APPLICATION

This application claims foreign priority of Korean Patent Application No. 10-2013-0028405, filed on Mar. 18, 2013, which is incorporated by reference in its entirety into this application.

TECHNICAL FIELD

The present invention relates to the apparatus for substrate transportation required to manufacture semi-conductor, display unit etc., more particularly, to the substrate transporting method and the relevant apparatus by and in which the substrate is to be coupled with the track set and fixed to carry, mostly in vacuum, the said substrate and to be transported by means of electrostatic force formed between the substrate and track.

BACKGROUND OF THE INVENTION

Conventional technologies in semiconductor manufacturing processes for OLED devices and the like have employed mechanical measures including robot arms to transport in vacuum the substrate, supporting the weight of and carrying them. The technologies exploiting the mechanical measures, however, are complicated incurring high costs and requiring large space with significant weight and may bring about adverse effects on the devices they produce due to unwanted particles. The mechanical measures aforementioned require a chucking procedure that attaches the substrate to the transporting apparatus. A variety of chucks including vacuum, electrostatic, magnetic type are used in the procedure and the electrostatic chuck, inter alia, in general, lets the substrate be attached to the substrate holder (namely "chuck plate") by means of electrostatic force and carries them. (Refer to Korea Registered Patent No. 10-1001454, etc.). The electrostatic type, however, also employs mechanical measures subsequent to the chucking procedure, thus the said problem naturally remains unchanged.

Objectives

The purpose of this invention is to meet the challenge aforementioned providing a novel, non-contact method and apparatus in a way that transports the substrate along the track by replacing conventional chucks which support the weight of the substrate and attach them, in a contact way, to the chuck plate through the mechanical means.

Methods

This invention, for the purpose of the intent aforementioned, shall provide a method and apparatus by and in which a track is to be mounted along the path along which the substrate is to be transported; a number of conductor areas with a certain clearance placed among them are to be aligned on the track; conductors are to be attached to or coated on the substrate which is to be carried along the track aforementioned; an electrostatic field generated by applying a voltage to the conductors aligned on the track to electrify them is to induce charges in the conductor' on the substrate located nearby, applying attractive force between the track and substrate aforementioned for the substrate to levitate towards the track; and in the floated state as such, the substrate is to slide over and along the track with a certain distance from the track.

This invention, in addition, in order to ensure the substrate to be transported by electrostatic floating without contact to the track maintaining a certain distance due to electrostatic force, shall provide a means, as a measure to maintain the distance, to control the applied voltage including a feedback system which senses the distance and turns it back as the feedback.

Effects of the Invention

This invention, as such, by at least minimizing or altogether eliminating mechanical factors and by providing a substrate transporting system in vacuum shall have the following effects.

Replace existing substrate transporting systems, heavy-weighted and complicated incurring high costs in manufacturing and maintaining, with a light-weighted and uncomplicated one not incurring high costs of equipment; and Having an advantage, in particular, in view of the fact that the system for the purpose of this invention is to, by introducing a floating transporting system that at least minimizes or altogether eliminates mechanical contact, at least minimize or altogether eliminate particle generation.

DETAILED DESCRIPTION OF THE INVENTION

An exemplary preferred embodiment is to be described in detail hereafter referring to attached drawings.

A Preferred embodiment of the apparatus for substrate transportation using electrostatic floating (levitation).

Since the lower surface[iii] of the substrate should be exposed to the vapor deposition source for OLED evaporation, the track that holds the substrate to prevent it from falling down by gravity should be placed above the substrate, and the substrate placed below should be carried being floated by means of electrostatic force. The substrate and track thus are to be configured in accordance with FIG. 1 for the substrate to be coupled, being floated towards the track, with the track.

Figure 1:
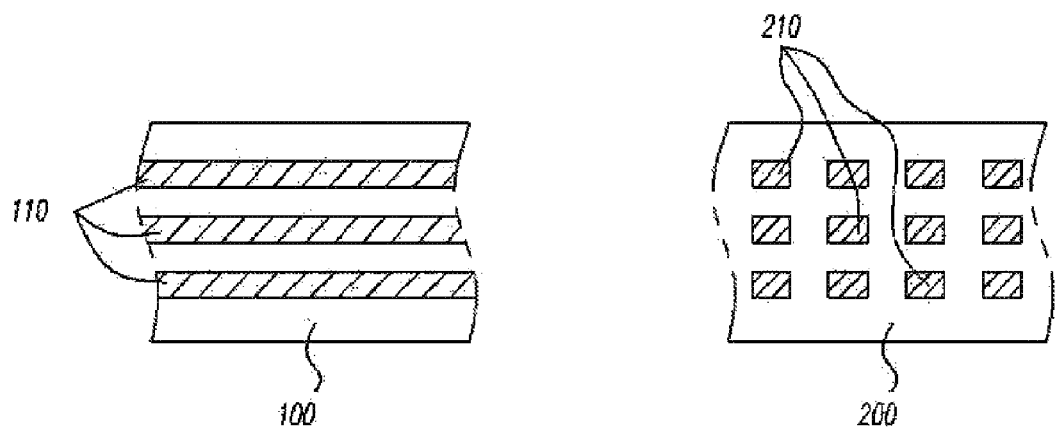
FIG. 1 is a top view, as an exemplary preferred embodiment, that illustrates the conductors (110) aligned on the substrate (100) and a number of conductors (210) with a clearance placed among them on the track (200)

FIG. 1 illustrates the shape of the conductors (110, 210) that are formed, to implement the substrate chuck using electrostatic floating for the purpose of this invention, on the substrate (100) and the track (200).

A number of conductors (110) in a solid line are to be formed on the substrate (100) side while a number of conductors (210) in a dotted line are to be formed on the track (200) side. Conductors in a solid line (110) and in dotted lines (210) are indicated in three lines respectively for the purpose of exemplification but minimum number is just 1. The conductors (210) separated by a clearance on the track (200) side are to be connected to cathode and anode, by turns, which, without any electric connection to the conductors on the substrate side, ensures the conductors on the substrate and the track to form a capacitor generating induced charges on the substrate (100) side. In case that electric connection is to be formed in the conductors on the substrate side, the conductors on the both sides may be manufactured in solid lines.

The conductors (110, 210) may be readily formed by attaching conductive film while it may be materialized by a variety of coating methods including spin coating, printing, sputtering and the like.

Figure 2:
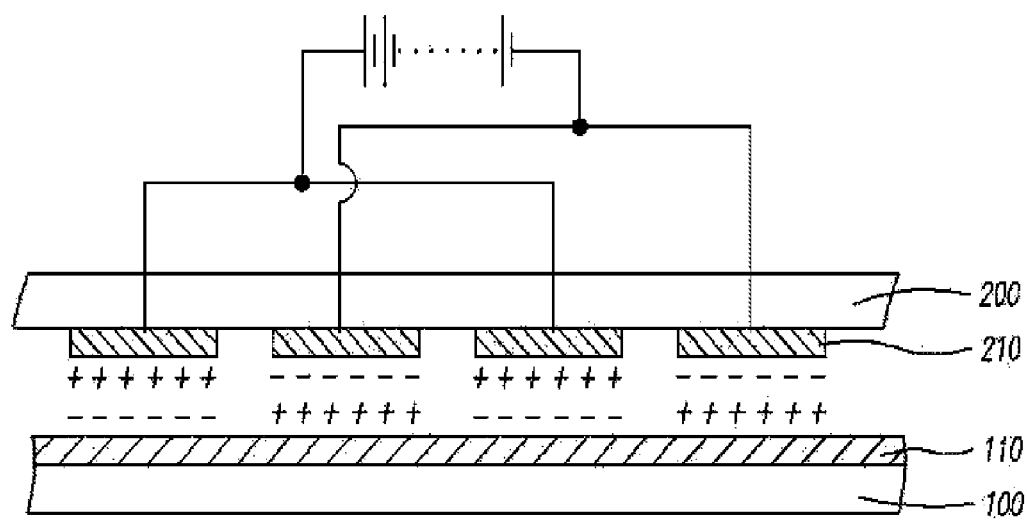
FIG. 2 is an outline drawing of the chuck, composed of the substrate (100) and track (200) referred to in FIG. 1, for the electrostatic floating of the substrate.

The substrate (100) and the track (200) with corresponding conductors (110, 210) and thus induced charges are to be roughly configured as illustrated in FIG. 2.

This shall mean that a voltage is to be applied, by means of power connection, to each of the conductors (210) in dotted lines on the track side but any two consecutive conductors are to be connected to different polarity each other. The conductors (210) on the track side, under which a series of positive and negative charges are induced by turns, are to induce charges opposite to theirs in the conductors (110) below in solid lines that are separated by a clearance on the substrate side. Therefore, on the conductors (110) on the substrate appear a series of positive and negative charges by turns which are adjacent to each other and complementary to those of the conductors (210) on the track, which brings about electrostatic attraction that is to float the substrate (100) towards the fixed track (200). Because the conductors on the substrate are fabricated in continuous solid lines, the configuration of those charges aforementioned is to be maintained, being formed in any case underneath the conductor plates on the track, even if the substrate is carried to and fro, the attractive force is thus to retain its application as such. This method has an advantage in view of the fact that it brings out, without any need for electrical connection to the conductors on the substrate, the potential difference and electrostatic attraction required therein.

The substrate should be transported, by means of electrostatic attraction, along and above the track maintaining certain distance from the track, because electrostatic attraction is inversely proportional to, as shown in the calculation as follows, the square of the distance, it is to increase as the distance that separates the substrate from the track decreases to destroy the defined clearance rendering those components attach to each other altogether, which is regarded as a drawback.

Suppose that the distance, d, that separates two conductive plates with each being placed on the substrate and the track, respectively, is considerably smaller than the width, w, between the substrate and the track, that is to say d<<w. Those two conductive plates are then to construct a parallel plate capacitor with a capacitance of $C=\epsilon_0 A/d$ and a charge of $Q=CV$ is electrified when a voltage of V is applied between those plates, where $\epsilon_0$ and A is the permittivity of vacuum and the area in the conductive plates opposite and parallel to each other, respectively. Then the induced charges in the capacitor is to possess electrostatic potential energy, $U=(\frac{1}{2})CV^2 = (\epsilon_0 A/d)V^2$, and the attractive force, F, applied between those plates is thus to be $F=(\epsilon_0 A/d^2)V^2$.

The attractive force is to soar as d, the distance, gets smaller, finally rendering the substrate attached to the track, which should be prevented requiring an appropriate mean to maintain a certain clearance.

It is necessary to additionally equip a non-contact propelling (driving) device or linear motor that enables the substrate to accelerate, decelerate, or adjust its transportation velocity without a mechanical contact.

Figure 3:
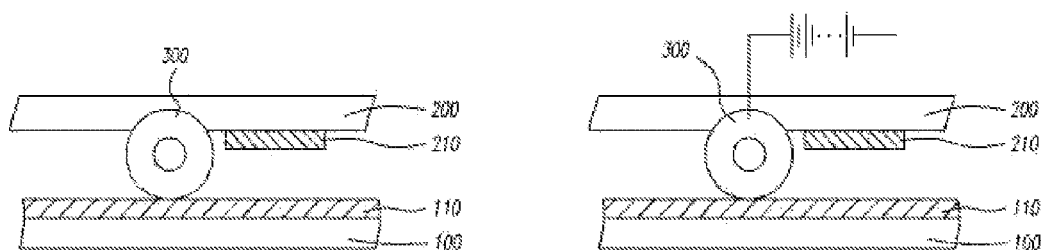
FIG. 3 is a rough cross-sectional view that indicates that the track (200) is equipped with the roller (300) to drive horizontally the substrate chuck using electrostatic floating referred to in FIG. 2.

Thus, this invention hereby presents the installment of roller (300), as depicted in FIG. 3, on the side of the track (200) for the purpose of [0021].

Preferred Embodiment 1 of the Substrate Transportation Using Electrostatic Floating The track (200) is to be equipped with the roller (300) with a part of the lower portion of the roller (300) wheel protruding to a certain extent from the bottom of the track (200). The substrate (100) floated by means of electrostatic force is thus to contact to the roller not being attached to the track (200) with the help of the roller (300) maintaining a certain clearance from it and also moving horizontally by the rolling of the roller (300). In other words, the substrate (100) is, with the help of the roller (300), to keep a distance from the track (200) not being attached to it and to be transported horizontally with the roller (300) rotated by driving, for example, a motor. Nevertheless, the method aforementioned forms a mechanical contact on the roller (300), it may, in comparison with the existing ones, minimize the contact area down to the tiny point of contact making the contact configuration even simpler, considerably reducing particles produced.

Because the roller (300) aforementioned does not participate in any electrical work if it is assembled of dielectric materials, the voltage application method aforementioned does not incur any problem at all, where the roller (300) is to act only as a component that maintains the clearance between the substrate floated and the track and as a means to drive the substrate.

Preferred Embodiment 2 of the Substrate Transportation Using Electrostatic Floating In case that the roller (300) is to be composed of conductive materials, different from the one referred to in the said Preferred Embodiment 1, while the roller (300) is to be rendered to roll keeping a contact to the conductors (110) on the substrate, charges are to be supplied by applying any adequate amount of voltage to the conductors (110) on the substrate via the conductive roller (300), where the roller (300) is to play multifaceted roles as a component that maintains the clearance, a carrier that transports the substrate and a power supply.

Other, more convenient voltage configurations are feasible if voltage is allowed to be applied to the conductor (110) on the substrate. For example, if the conductors on the track are formed in solid lines while the cathode and the anode are connected to the track-side conductor (220) and the substrate-side conductor (110), respectively, they are to attract each other.

Figure 4:
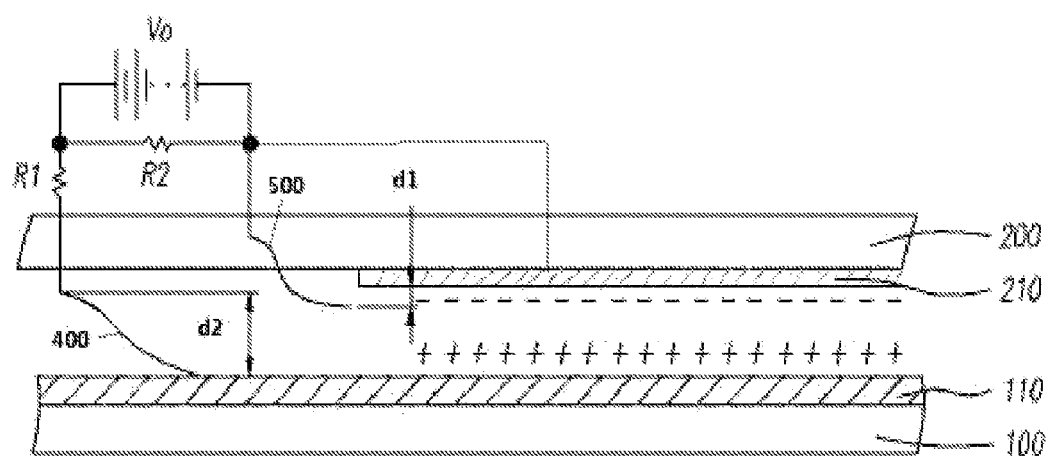
FIG. 4 is a rough configuration drawing that indicates, pursuant to another exemplary preferred embodiment of this invention, how the substrate chuck using electrostatic floating is to be configured.
Figure 5:
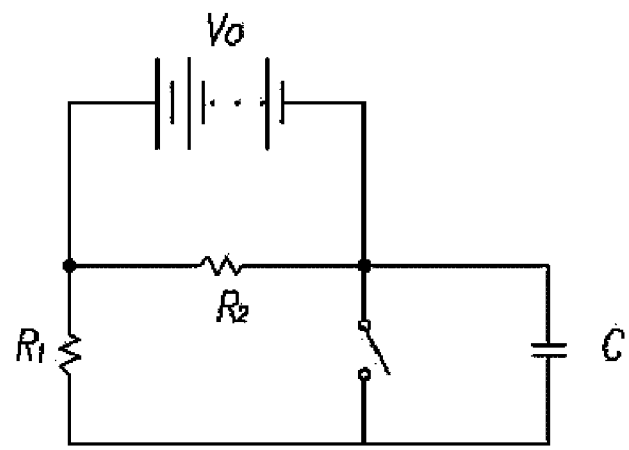
FIG. 5 is the circuit diagram derived from FIG. 5.

Preferred Embodiment 3 of the Substrate Transportation Using Electrostatic Floating Another method to apply voltage to the conductor (110) on the substrates that should be carried without using the roller, different from the said Preferred Embodiments, shall render the power cable concerned elastically contacted to the substrate-side conductors (110) sliding on them. This method more of produces almost no particle, if it may be considered to produce a lot more than in the case employing a conductive roller, because the power cable actually applies a trace of its force elastically to the contact area, of which principle is equivalent to that utilized in the pantograph, the collector trolley of a electric train. Upon using two power cables (400, 500) that are not identical from each other in terms of the length of protrusion from the track, the distance may be consistently maintained, apart from the distance-maintaining method with a roller-aided mechanical way incorporated, by modifying the amount of the voltage applied between the track-side conductor (200) and the substrate-side conductor according to the distance concerned between them. Those two power cables (400, 500) are to be arranged in the space between the track-side conductor (220) and the substrate-side conductor (110) via a circuit composed of the power source and resistances as shown in FIG. 4. If one power cable (400) is to be placed underneath, by $d_2$, the bottom surface of the track-side conductor (220) while the other (500), underneath, by $d_1$, the same surface$^v$, the distance between those conductors should be d, of which configuration is exactly equivalent to the circuit referred to in FIG. 5. In this configuration, if the latter power cable (500) is to be allowed to act as an electric contact (that is a switch) fixed at a specific location, another equivalent circuit as shown in FIG. 5 may be generated.

In case that the substrate (100) is floated by means of electrostatic attraction, the conductor (110) is to contact to the first power cable (400) in the first instance. Strong electrostatic attraction is then generated to levitate the substrate (100) towards the track (200) to reduce the distance between the two power cables (400, 500) rendering d modified, which brings about the phenomena as follows:

In other words, if the range of the distance d is $d_1 < d < d_2$, the potential difference between the conductors on the substrate (100) and on the track (200) should be $V_0$; if $d \ll d_1$, they are to be shunted and the potential difference is to fall off to zero (V=0); if the substrate approaches too close to the track ($d < d_1$), the potential difference should be zero eliminating the electrostatic attraction, the substrate thus is to fall down by means of gravity widening the distance between them whereas, if the distance goes up to a great extent ($d > d_1$), because the potential difference, $V_0$, is to be applied, the substrate is to be drawn down to result in the decrease of the distance. Such distance control following the natural law shall prevent the substrate from being attached to the track maintaining a certain clearance and allow it to be carried being floated. In some cases, other methods rather than the rotation of the roller to obtain the driving force are required in order to carry the substrate.

Figure 6:
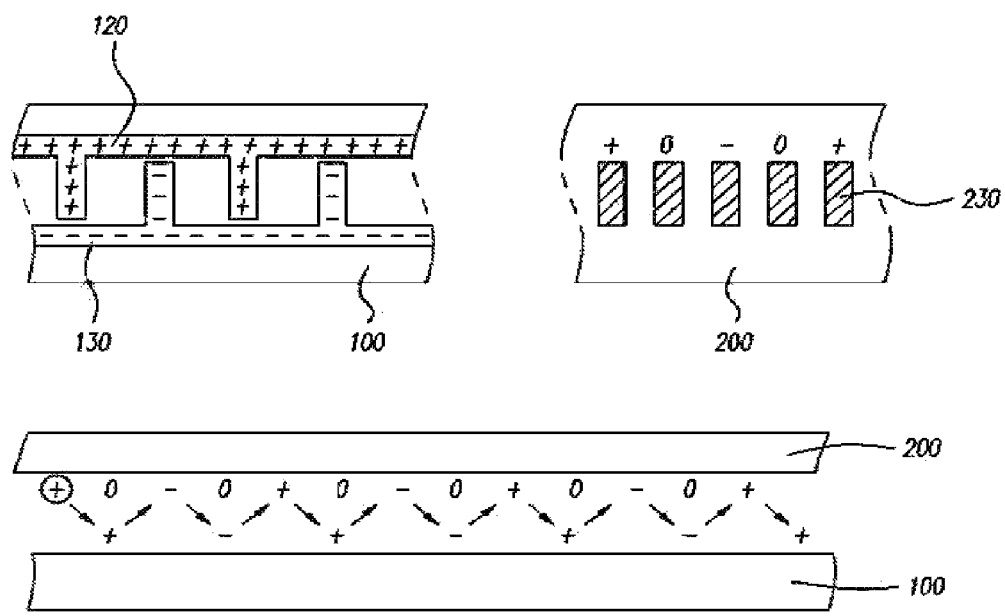
FIG. 6 is a top view that illustrates the alignment of the conductors on the substrate and the track side, respectively, which is configured to drive horizontally the substrate pursuant to the method described in FIG. 4.

FIG. 6 illustrates an electrostatic linear motor as an exemplary means to be used in such cases aforementioned. The said linear motor may be adequately configured by modifying the shape of the conductors manufactured on the substrate and on the track and the polarity of the voltage applied as such.

This shall mean that conductor couples (120, 130) are to be engaged to each other with a clearance between them on the substrate side. On the track side are to be manufactured dotted conductors (230) with a width to a certain extent. In case that one of the substrate-side conductors, e.g. the conductor (120), is connected to the positive electrode of the power supply while the opposite conductor (130) engaged to the former conductor is connected to the negative one, it brings about a phenomenon equivalent to one, in which the positive and negative voltage is applied by turns. Meanwhile, the thick, dot-patterned conductors (230) manufactured on the track-side are to be connected to the voltage with a cycle of +/0/−/0 that is repeated. If the substrate and the track approaches proximately to each other, when the charges on the track (230) side are placed in the +/0/−/0 arrangement aforementioned with a proper gap between them with the voltage polarity set up as such, +/− (the positive and the negative) charge of the substrate-side conductors (120, 130) are to be placed underneath the 0 charge of the track-side conductor (230), respectively. Such a charge arrangement may be embodied by modifying the width of and gap between the conductors (120, 130). The positive charge in the substrate-side conductor (130), therefore, is to be affected by repulsive and attractive force from the positive charges located upper posterior and from the negative ones located upper anterior, respectively while the negative charge in the substrate-side conductor (120) is to be affected by repulsive and attractive force from the negative charges located upper posterior and from the positive ones located upper anterior, respectively, consequently moving forward. Prior to the total stability of the electrostatic attraction when the substrate moves forward by a section or so, the cycle of the voltage applied to the track-side conductor (230), +/0/−/0 should be changed to 0/+/0/− in order to move it forward again. In other words, a sort of 3-phase alternating current is to be applied to the track-side conductor (230) controlling the frequency in accordance with the velocity by which the substrate moves forward in order to keep moving it forward. For information purpose, because the substrate transportation aforementioned is implemented in a vacuum chamber, it does not occasion any electrical discharge even when high voltage is applied, which is very useful in practical uses.

The said electrical linear motor is very useful as a means for substrate transportation and may be exploited in the initial phase during which the substrate begins floating. In such cases, the substrate is to be levitated with the polarity of the voltage on both sides set for attraction to be brought about then to be transported in the way aforementioned.

Various kinds of electrostatic linear motors other than that aforementioned have been known.

To achieve a state that eliminates altogether the mechanical contact derived by the elasticity of a spring, a method may be made available in accordance with which, in a conductor configuration as referred to, e.g. in FIG. 1, without a pantograph exploited, with no electrode connected to the substrate-side conductor, the positive and the negative electrode are to be applied by turns only to the track-side conductor as described above. In case that no electric contact is available to the substrate-side conductor, a means shall be prepared to maintain a constant distance by remotely sensing the distance via a feedback system: if the distance decreases, the voltage is to get smaller between the cathode and anode connected, by turns, to the track-side conductor and vice versa, a preferred embodiment of which is illustrated in FIG. 7.

Preferred Embodiment 1 of the Feedback System for Distance Control

Figure 7:
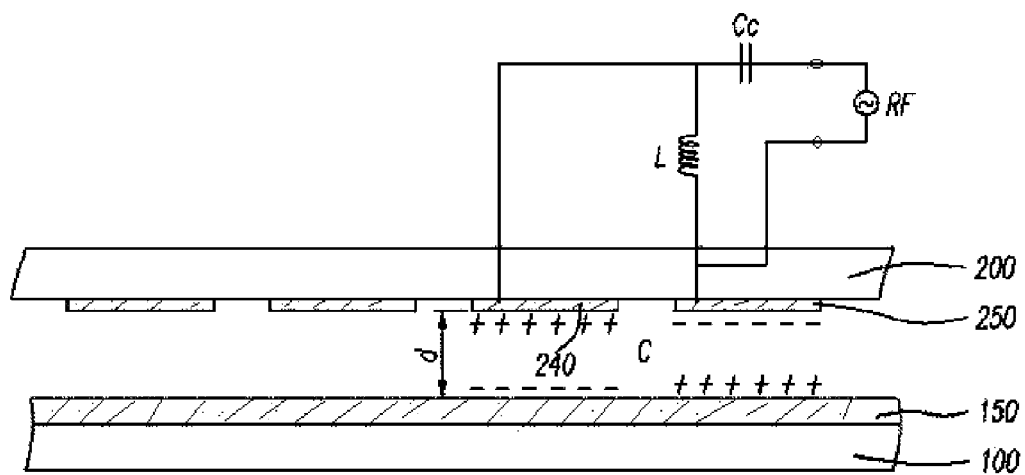
FIG. 7 is a rough configuration drawing that illustrates the feedback system that is to maintain, in the substrate chuck using electrostatic floating, the distance between the substrate and the track.
Figure 7:
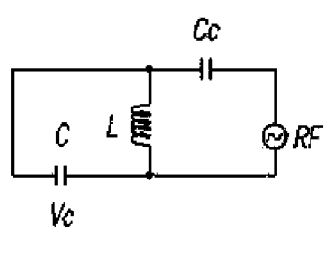
Figure 7:
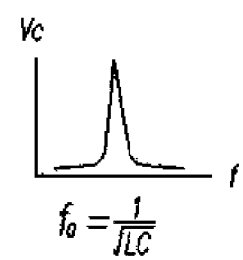
Figure 7:
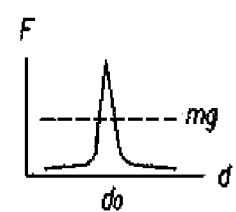

The track-side conductors (240, 250) and substrate-side conductor (150), as shown in FIG. 7, form a parallel plate capacitor, where its capacitance, C, is inversely proportional to the distance, d, which may be expressed as C∝(1/d). This capacitor forms an L-C resonance circuit when connected to a coil as shown in FIG. 7. If a RF power source with a constant frequency, $f_0$, is connected, via a coupling capacitor, Cc, to this L-C resonance circuit, a resonance takes place at the distance where C meets the condition, $2\pi f_0 = 1/\sqrt{(LC)}$. When a resonance takes place, the voltage applied to C increases consequently raising the electrostatic attraction force, therefore the attraction changes as a function of distance as plotted in FIG. 7. Right below the resonance distance is an area, of which slope is positive, across which the attraction gets stronger as the distance increases, therefore, exploiting this area, it is possible to levitate the substrate maintaining a constant distance.

Preferred Embodiment 2 of the Feedback System for Distance Control

Figure 8:
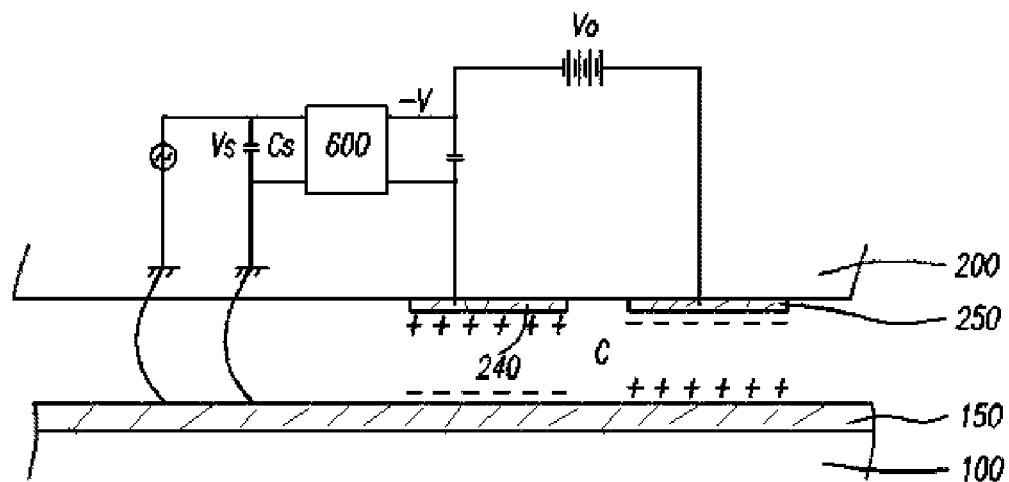
FIG. 8 is a rough configuration drawing that illustrates yet another preferred embodiment in which the feedback system referred to in FIG. 7 is modified.
Figure 8:
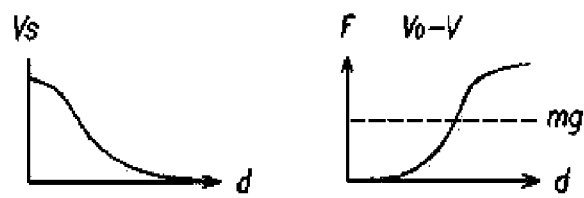

FIG. 8 illustrates another preferred embodiment that provides a condition in which the substrate is to be floated with the distance from the fixed plate kept constant by feeding back the distance data. A direct current power source $V_0$ and a RF power source are used in this example as the main power source to levitate the substrate and the power source to control the distance, respectively. The RF voltage, $V_{RF}$, supplied via a transformer is to be divided when it goes through the two capacitor, C and Cs, then a voltage of $V_{RF}Cs/(C+Cs)$ is to be applied across the two ends of Cs. This voltage is to be the main direct voltage of $NV_{RF}Cs/(C+Cs)$ after going through a rectifier and N times voltage multiplier then to be applied in the opposite direction to that of the main voltage $V_0$. The voltage across C, the capacity composed of the track (200)—and substrate (100)—side conductors comes down to $V_0 - NV_{RF}Cs/(C+Cs)$ lending a proportionality dependence to distance, d, to the attractive force, F as plotted in FIG. 8. Because the area under this plots, of which slope is positive, is larger than that of the function depicted in FIG. 7, the distance tolerance that allows the substrate to be floated stably gets larger, which means that the substrate may be floated more stably securing a certain amount of the distance.

Figure 9:
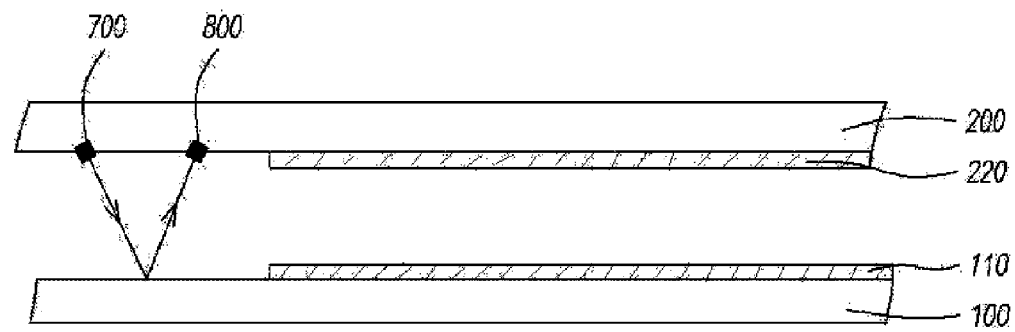
FIG. 9 is a rough configuration drawing that illustrates the feedback system that is to maintain the distance, by means of a photo distance sensor, between the substrate and the track.

FIG. 9 illustrates the feedback system using a photo distance sensor that may be installed either on the substrate or track side.

The light intensity radiated from the photo distance sensor is to diminish as the distance increases. This intensity is transformed to voltage going through a photo diode and its measurement is to be input to the base of the transistor meaning that the voltage applied across C, the capacity composed of the track and substrate, increases as the distance increases, which leads to a very stable floating of the substrate. This method has an advantage in view of the fact that it does not involve a high frequency power source.

The description thus far is nothing more than an exemplification of the technical thoughts of this invention and a person skilled in the art to which this invention belongs may, not deviating from the scope of the essential features of this invention, amend and modify this example. In this perspective, the preferred embodiments demonstrated in this invention are not to restrict but to expound the technical thoughts of this invention while the scope of the technical thoughts of this invention shall not be restricted within such examples. The scope of the protection for this invention should be interpreted based on the claims as follows and all the technical thoughts in the scope equivalent to that of those Claims should be comprehended to be included in the scope of the rights of this invention.

The invention claimed is:

1. An apparatus for substrate transportation using electrostatic floating, comprising:
   a fixed track having one or more conductors;
   a substrate having one or more conductors;
   a voltage application means for receiving electrical power from a power supply and applying an electrical potential difference between the one or more conductors of the track and the one or more conductors of the substrate to generate an electrostatic force that levitates the substrate during operation;
   means for maintaining the substrate in a spaced apart relationship with the track; and
   means for transporting the substrate along the track without physical contact between the track and the substrate.

2. The apparatus according to claim 1, wherein the one or more conductors of the track are arranged in the form of one or more dotted lines while the one or more conductors of the substrate are arranged in the form of one or more solid lines, and
   wherein the one or more conductors of the track are electrically separated from each other, each of the one or more conductors of the track has a different electrical polarity from a neighboring conductor during operation, and a charge on each of the one or more conductors of the track induces a complementary charge on a corresponding conductor of the substrate during operation.

3. The apparatus according to claim 1, wherein the means for maintaining the substrate in a spaced apart relationship with the track comprises a roller that is attached to the track and protrudes a preset distance from a bottom of the track to thereby prevent physical contact between the track and the substrate.

4. The apparatus according to claim 3, wherein the roller is made of electrically conductive material and coupled to a power source during operation and the one or more conductors of the substrate are electrically coupled to the power source upon contacting the roller during operation.

5. The apparatus according to claim 1, wherein the means for maintaining the substrate in a spaced apart relationship with the track includes an electrical line that electrically couples the one or more of the conductors of the track to a high frequency power supply and an inductor; and
   wherein the inductor and a capacitor formed by the one or more conductors of the track and the one or more conductors of the substrate form an L-C resonance circuit.

6. The apparatus according to claim 1, wherein the voltage application means includes a first electrical line that is coupled to the one or more conductors of the track and a second electrical line that is coupled to a first resistor and a first power cable in series and wherein the first power cable is made of electrically conductive elastic material and extends into a space between the track and the substrate,
   wherein the first electrical line is further coupled to a second resistor and a second power cable and wherein the second power cable is made of electrically conductive elastic material and extends into the space between the track and the substrate, and
   wherein the first and second power cables contact the one or more conductors of the substrate when the substrate moves in the space to thereby control a distance between the track and substrate.

7. The apparatus according to claim 1, wherein the means for transporting the substrate comprises an electrostatic motor.

8. The apparatus according to claim 7, wherein the electrostatic motor comprises:

a pair of conductors formed on the substrate; and a plurality of dotted conductors formed on the track with a preset clearance therebetween;

wherein two voltages in opposite polarity are respectively applied to the pair of conductors and a repeated pattern of positive/zero/negative/zero voltages is applied to the plurality of dotted conductors during operation.

9. The apparatus according to claim 1, wherein the means for maintaining the substrate in a spaced apart relationship with the track comprises:

a sensor for measuring a distance between the substrate and the track; and means for adjusting, based on an output signal from the sensor, the electrical potential difference between the one or more conductors of the track and the one or more conductors of the substrate to thereby control the distance.

10. The apparatus according to claim 9, wherein the sensor comprises:

a first capacitor formed by the one or more conductors of the track and the one or more conductors of the substrate and coupled to a high frequency power source during operation; and a second capacitor coupled to the first capacitor in series and coupled to the high frequency power source during operation;

wherein the sensor measures the distance between the substrate and the track by reading voltages across the first and second capacitors.

11. The apparatus according to claim 9, wherein the sensor is a photo distance sensor.

12. An apparatus for substrate transportation using electrostatic floating, comprising:

a track having a plurality of electrodes formed on a bottom surface thereof, wherein the plurality of electrodes are physically separated from each other;

a substrate disposed under the track and having a plurality of electrodes formed in one or more solid lines on a top surface thereof, wherein the plurality of electrodes on the track and the plurality of electrodes on the substrate form a capacitor and the substrate moves toward the track when an electrical potential difference is applied between the plurality of electrodes on the track and the plurality of electrodes on the substrates;

means for applying the electrical potential difference;

means for transporting the substrate along the track without physical contact between the track and the substrate; and means for controlling a distance between the track and the substrate.

* * * * *